(12) United States Patent
Gotoh et al.

(10) Patent No.: US 7,553,469 B2
(45) Date of Patent: Jun. 30, 2009

(54) ALUMINUM NITRIDE POWDER AND ALUMINUM NITRIDE SINTERED COMPACT

(75) Inventors: Takeshi Gotoh, Omuta (JP); Hiroshi Murata, Omuta (JP); Kohki Ichikawa, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 142 days.

(21) Appl. No.: 10/590,942

(22) PCT Filed: Mar. 29, 2005

(86) PCT No.: PCT/JP2005/005863

§ 371 (c)(1),
(2), (4) Date: Aug. 28, 2006

(87) PCT Pub. No.: WO2005/092789

PCT Pub. Date: Oct. 6, 2005

(65) Prior Publication Data

US 2007/0184966 A1    Aug. 9, 2007

(30) Foreign Application Priority Data

Mar. 29, 2004  (JP) ............................... 2004-094567

(51) Int. Cl.
*C01B 21/072* (2006.01)
*C04B 35/581* (2006.01)

(52) U.S. Cl. ................. 423/412; 501/98.4; 501/98.5

(58) Field of Classification Search .................. 423/412
See application file for complete search history.

(56) References Cited

U.S. PATENT DOCUMENTS

| 3,307,908 | A | * | 3/1967 | Mandorf, Jr. ................. 423/412 |
| 4,484,943 | A | * | 11/1984 | Miura et al. ................... 75/351 |
| 4,869,925 | A | * | 9/1989 | Hiai et al. ................... 427/96.1 |
| 5,061,663 | A | * | 10/1991 | Bolt et al. ................... 501/95.1 |
| 5,126,121 | A | * | 6/1992 | Weimer et al. .............. 423/412 |
| 6,294,275 | B1 | * | 9/2001 | Natsuhara et al. ........... 428/698 |

FOREIGN PATENT DOCUMENTS

JP        3-228809        * 10/1991

(Continued)

*Primary Examiner*—Wayne Langel
(74) *Attorney, Agent, or Firm*—Oblon, Spivak, McClelland, Maier & Neustadt, P.C.

(57) ABSTRACT

To provide an aluminum nitride powder and an aluminum nitride sintered body which satisfy both high thermal conductivity of an aluminum nitride sintered body and reduction in the shrinkage factor at the time of sintering.

An aluminum nitride powder characterized in that it has local maximum values in size in regions of from 3 to 15 μm, from 0.5 to 1.5 μm and 0.3 μm or less, the proportions of particles in the respective regions are from 40 to 70%, from 25 to 40% and from 0.5 to 20% on the volume basis, and it has an oxygen amount of from 0.5 to 1.5 mass %. An aluminum nitride sintered body which is a sintered body of a powder mixture containing the above aluminum nitride powder and a sintering aid, characterized by having a thermal conductivity of at least 190 W/m·K and a shrinkage factor represented by the percentage of {(dimensions of the molded body before sintering)−(dimensions of the sintered body after sintering)}/(dimensions of the molded body before sintering) of at most 15%.

9 Claims, 1 Drawing Sheet

FOREIGN PATENT DOCUMENTS

| | | |
|---|---|---|
| JP | 5 139709 | 6/1993 |
| JP | 5 238830 | 9/1993 |
| JP | 7 330315 | 12/1995 |
| JP | 2000 86213 | 3/2000 |
| JP | 2001 139378 | 5/2001 |
| JP | 2003-119010 * | 4/2003 |

* cited by examiner

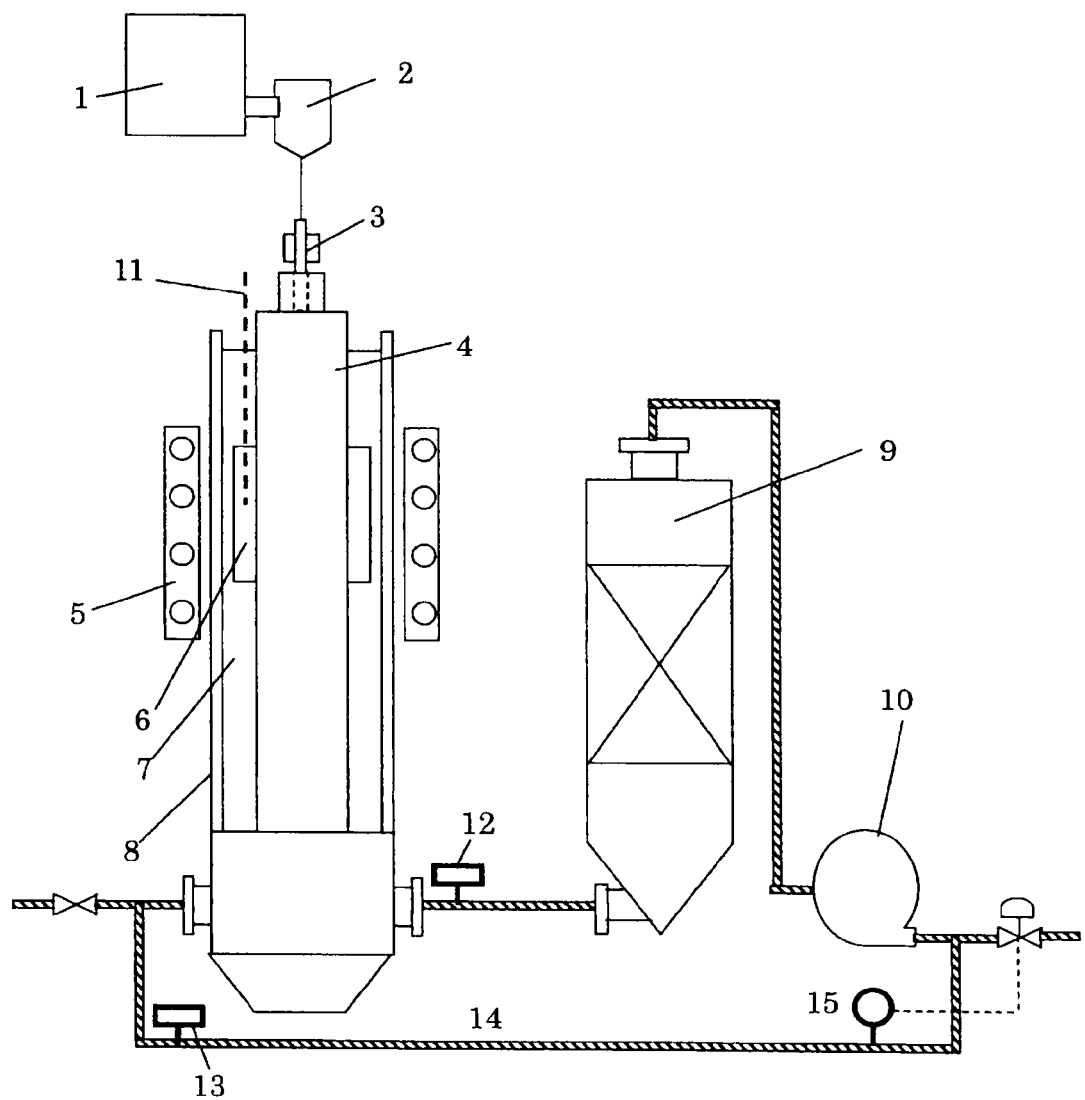

ALUMINUM NITRIDE POWDER AND ALUMINUM NITRIDE SINTERED COMPACT

TECHNICAL FIELD

The present invention relates to an aluminum nitride powder and an aluminum nitride sintered body.

BACKGROUND ART

Heretofore, along with high integration of a circuit board to be utilized for e.g. a powder module, heat generated by a semiconductor device tends to increase. In order that the heat be effectively dissipated, various methods have been studied, and ceramics such as alumina, beryllia, silicon nitride and aluminum nitride have been utilized. Among them, aluminum nitride is a suitable material in view of high thermal conductivity, high insulating properties, harmfulness, etc., and in addition, it has attracted attention since it has plasma resistance and a coefficient of thermal expansion close to that of silicon in recent years, and has been used as a jig for a semiconductor production apparatus in the form of a single substance, as embedded in a metal heater, as fixed to a metal, etc. In any of these application forms, an aluminum nitride sintered body having a high degree of parallelization and being less likely to be warped has been desired. In order to obtain such an aluminum nitride sintered body, it is important to produce an aluminum nitride sintered body having small sintering shrinkage. Here, the sintering shrinkage means a phenomenon such that the dimensions of the sintered body after sintering are smaller than the dimensions of the molded body before sintering, and the sintering shrinkage becomes necessarily small when a high filing rate of a powder can be achieved and the density of the molded body before sintering can be increased.

Heretofore, for production of an aluminum nitride powder for production of an aluminum nitride sintered body, an alumina reduction method and a method of direct nitriding of a metal aluminum powder have been commonly employed, but these methods have both merits and demerits. An aluminum nitride powder obtainable by the alumina reduction method has a uniform particle size and a small oxygen amount as compared with the direct nitriding method, whereby it is easily sintered to produce a sintered body having a high thermal conductivity, but the shrinkage factor at the time of sintering tends to be large, warpage or deformation is likely to occur, and the production cost tends to be high. On the other hand, in the direct nitriding method, the aluminum nitride powder will be easily produced at a low cost, but since the method comprises a grinding step, the obtained aluminum nitride powder tends to contain an increased amount of impurities such as oxygen and the thermal conductivity can hardly be higher than that achieved by the alumina reduction method. Further, neither of the aluminum nitride powders obtained by these production methods has been able to sufficiently achieve both higher thermal conductivity of the aluminum nitride sintered body and reduction in the shrinkage factor at the time of sintering.

The present applicant has proposed (Patent Document 1) that for production of an aluminum nitride sintered body which achieves both high thermal conductivity and small sintering shrinkage, an aluminum nitride powder having a specific particle size and a specific oxygen amount may be used, and that such an aluminum nitride powder can be prepared by producing several types of aluminum nitride powders differing in the oxygen amount and the particle size and suitably combining them.

Patent Document 1: Japanese Patent No. 3403500

DISCLOSURE OF THE INVENTION OBJECT TO BE ACCOMPLISHED BY THE INVENTION

It is an object of the present invention to provide an aluminum nitride powder which can achieve both high thermal conductivity of an aluminum nitride sintered body and reduction in the shrinkage factor at the time of sintering, and an aluminum nitride sintered body, for example, an aluminum nitride sintered body having a thermal conductivity of at least 190 W/m·K and a shrinkage factor at the time sintering of at most 15%.

MEANS TO ACCOMPLISH THE INVENTION

The present inventors have conducted extensive studies and as a result, they have found an aluminum nitride powder and an aluminum nitride sintered body which achieve the above object and found a process for producing an aluminum nitride powder to be used for production of the aluminum nitride sintered body.

Namely, the present invention provides the following.

(1) An aluminum nitride powder characterized in that it has local maximum values in size in regions of from 3 to 15 μm, from 0.5 to 1.5 μm and 0.3 μm or less, the proportions of particles in the respective regions are from 40 to 70%, from 25 to 40% and from 0.5 to 20% on the volume basis, and it has an oxygen amount of from 0.5 to 1.5 mass %.

(2) An aluminum nitride non-fired molded body characterized by comprising a molded body of a powder mixture containing the aluminum nitride powder as defined in the above (1) and a sintering aid.

(3) An aluminum nitride sintered body which is a sintered body of the aluminum nitride non-fired molded body as defined in the above (2), characterized by having a thermal conductivity of at least 190 W/m·K and a shrinkage factor represented by the percentage of {(dimensions of the molded body before sintering)−(dimensions of the sintered body after sintering)}/(dimensions of the molded body before sintering) of at most 15%.

(4) The aluminum nitride sintered body according to the above (3), which contains the sintering aid in an amount of from 1 to 5 parts by mass per 100 parts by mass of the aluminum nitride powder.

(5) The aluminum nitride sintered body according to the above (3) or (4), wherein the sintering aid is yttrium oxide or calcium oxide.

(6) A process for producing the aluminum nitride powder as defined in the above (1), which comprises dispersively mixing a raw material aluminum powder having an average particle size of at most 40 μm and an oxygen amount of at most 0.5 mass % with a nitrogen gas in a proportion of at most 100 g per 1 Nm$^3$ of the nitrogen gas, atomizing the gas into a reaction tube for nitriding, and collecting the product in a collection system, characterized in that the oxygen concentration at a portion at which the temperature will be at least 100° C. in the reaction tube and the collection system is controlled to be at most 100 ppm, and the product is taken out at a temperature of at most 100° C.

(7) The process according to the above (6), wherein the formed aluminum nitride powder has a BET specific surface area of at least 10 m$^2$/g and a value of the oxygen amount (mass %)/the specific surface area (m$^2$/g) of from 0.1 to 0.2.

EFFECTS OF THE INVENTION

According to the present invention, an aluminum nitride powder and an aluminum nitride sintered body, which are excellent in both high thermal conductivity of the aluminum nitride sintered body and reduction in the shrinkage factor at the time of sintering, are provided. Particularly, an aluminum nitride sintered body having a thermal conductivity of at least 190 W/m·K and a shrinkage factor at the time of sintering of at most 15% is provided. Further, according to the present invention, a novel process for producing an aluminum nitride powder to be used for production of the aluminum nitride sintered body is provided.

BRIEF DESCRIPTION OF THE DRAWING

FIG. 1 is a diagram illustrating one example of an apparatus for production of an aluminum nitride powder.

MEANING OF SYMBOLS

1: feeder for aluminum powder
2: mixer
3: nozzle
4: reaction tube made of boron nitride
5: high frequency power source
6: graphite heating element
7: heat insulating material comprising porous carbon beads
8: quartz tube
9: bag filter
10: blower
11: temperature-sensing element made of glassy carbon
12: oximeter
13: oximeter
14: closed nitrogen circulating line
15: flow meter

BEST MODE FOR CARRYING OUT THE INVENTION

The present inventors have conducted extensive studies on the particle size construction and the oxygen amount of an aluminum nitride powder for production of an aluminum nitride sintered body having a thermal conductivity of at least 190 W/m·K and a shrinkage factor at the time of sintering of at most 15% and as a result, they have found the following. That is, in the above direct nitriding method for example, a metal aluminum powder is atomized in a furnace at high temperature in a nitrogen atmosphere and nitrided, and the obtained aluminum nitride powder is classified without being ground to produce aluminum nitride powders having various particle size distributions and they are suitable combined to achieve a specific particle size constitution, whereby the thermal conductivity will be high and the shrinkage factor at the time of sintering will be low.

The aluminum nitride powder to be used in the present invention is preferably an aluminum nitride powder produced by atomizing a metal aluminum powder in a furnace at high temperature in a nitrogen atmosphere for nitriding, particularly preferably one produced by injecting a metal aluminum powder from the top portion of a reaction tube having a nitrogen atmosphere heated at 1,850° C. or higher for nitriding. The details are disclosed in JP-A-2003-119010 for example. Using the aluminum nitride powder produced by the above method, various aluminum nitride powders differing in the particle size constitution and the oxygen amount can be obtained by changing the settings of a centrifugal wind power classifier for example, and the powders are suitable mixed considering the particle size constitution and the oxygen amount, whereby the aluminum nitride powder of the present invention can be obtained.

A conventional aluminum nitride powder produced by the alumina reduction method or the direct nitriding method may be used as one component to prepare the aluminum nitride powder of the present invention, but the aluminum nitride powder of the present invention cannot be produced by each aluminum nitride powder by itself, since it is difficult to produce particles of 10 μm or larger by the alumina reduction method, and the oxygen amount will be large by the direct nitriding method.

In the present invention, the particle size distribution can be measured by a laser diffraction method by measuring the frequency and the cumulative value of the volume distribution. The aluminum nitride powder of the present invention has local maximum values in size in regions of from 3 to 15 μm (hereinafter, particles having particle sizes in this region will be referred to as "coarse particles"), from 0.5 to 1.5 μm (hereinafter, particles having particle sizes in this region will be referred to as "medium particles") and 0.3 μm or less (hereinafter, particles having particles sizes in this region will be referred to as "fine particles"). These local maximum values can be determined by the frequency of the volume distribution, and the proportions of particles can be determined by the cumulative values in the respective regions.

If the local maximum value for the coarse particles exceeds 15 μm, the sintering properties will be adversely affected, whereby the thermal conductivity will not improve. On the other hand., if it is smaller than 3 μm, favorable sintering properties will be achieved, but the shrinkage factor at the time of sintering will be large. If the proportion of the coarse particles is less than 40%, the shrinkage factor at the time of sintering will be large, and if it exceeds 70%, the sintering properties will be adversely affected, whereby the thermal conductivity will not improve. Particularly preferably, the local maximum value for the coarse particles is from 5 to 10 μm, and the proportion of these particles is from 50 to 65%.

If the local maximum value for the medium particles is larger than 1.5 μm, since the particles sizes tend to be close to the local maximum value for the coarse particles, the sintering properties will be adversely affected, whereby the thermal conductivity will not improve. Further, if the local maximum value is smaller than 0.5 μm, since the particle sizes tend to be close to the local maximum value for the fine particles, the shrinkage factor at the time of sintering tends to be large, and the oxygen amount tends to increase as well, whereby achievement of high thermal conductivity will be adversely affected. If the proportion of the medium particles is less than 25%, the sintering properties will be adversely affected, and if it exceeds 40%, the shrinkage factor at the time of sintering tends to be large. Particularly preferably, the local maximum value for the medium powder is from 1.3 to 0.8 μm, and the proportion of these particles is from 25 to 35%.

If the local maximum value for the fine particles is larger than 0.3 μm, since the particle sizes tend to be close to the local maximum value for the medium powder, the shrinkage factor at the time of sintering will be large. If the proportion of the fine particles exceeds 20%, the oxygen amount tends to increase, and the thermal conductivity will be adversely affected. If it is less than 0.5%, the effect by the presence of the fine particles tends to be small, and the shrinkage factor at s the time of sintering will be large. Particularly preferably, the local maximum value for the fine particles is from 0.25 to 0.05 μm, and the proportion of these particles is from 5 to 15%.

The total amount of the above coarse particles, medium particles and fine particles is preferably 100%, but is not necessarily 100%, and another aluminum nitride powder may be contained so long as the above proportions of the particles are satisfied. The aluminum nitride powder of the present invention has an oxygen amount of from 0.5 to 1.5 mass %. If the oxygen amount is larger than 1.5 mass %, the sintering properties will be adversely affected and the thermal conductivity will not improve, and if it is smaller than 0.5 mass % also, the sintering properties will be adversely affected. The oxygen amount is particularly preferably from 0.8 to 1.3 mass %.

The aluminum nitride non-fired molded body of the present invention is one obtained by molding a powder mixture containing the aluminum nitride powder of the present invention and a sintering aid. Further, the aluminum nitride sintered body of the present invention is one obtained by sintering the above aluminum nitride non-fired molded body. The sintering aid to be used in the present invention may, for example, be preferably a compound of an alkaline earth metal or a compound of a transition metal. Specifically, it may, for example, be an oxide, a fluoride, a chloride, a nitrate, a sulfate, a carbonate or the like of an alkaline earth metal (such as Ca, Ba or Sr) or a transition metal (such as Y, La, Sc, Pr, Ce, Nd or Gd). Among them, preferred is yttrium oxide or calcium oxide. The sintering aid brings about high thermal conductivity in such a manner that it reacts with oxygen in the aluminum nitride powder i.e. an aluminum oxide to form a liquid phase of a composite oxide (such as $2Y_2O_3 \cdot Al_2O_3$, $Y_2O_3 \cdot Al_2O_3$ or $3Y_2O_3 \cdot 5Al_2O_3$), this liquid phase increases the density of the sintered body and at the same time, extracts e.g. oxygen as an impurity in the aluminum nitride particles and makes it be segregated as an oxide phase at the crystal grain boundary. If the amount of the sintering aid to be used is small, the liquid phase sintering tends to be insufficient, and if it is large, the proportion of the crystal grain boundary tends to be high, and the thermal conductivity will not increase in either case. In the present invention, the amount of the sintering aid to be used is preferably from 1 to 5 parts by mass per 100 parts by mass of the aluminum nitride powder.

To mix the aluminum nitride powder with the sintering aid, a ball mill or a rod mill may, for example, be used. The powder mixture may be molded as it is, or may be molded after it is granulated by e.g. a spray dryer method or a tumbling granulation method. Molding may be carried out, for example, by a dry press molding method or a cold isostatical press molding method (CIP method) alone or in combination. The press pressure in dry press molding is preferably from 50 to 300 MPa, particularly preferably from 100 to 250 MPa. In either of the dry press molding method and the CIP method, an organic binder is used as the case requires. Further, it is possible to mix the aluminum nitride powder, the sintering aid, the organic binder, and as the case requires, a plasticizer, a disperser or the like, and subject the resulting mixture to extrusion, doctor blade molding or the like.

As the organic binder, polyvinyl butyral, polyacrylate, polymethyl methacrylate, methylcellulose, polyethylene, wax, etc. may be used. In a case where an organic binder is used, the molded body before sintering is heated in a stream of a nitrogen gas, the air or the like at from 350 to 700° C. for from 1 to 10 hours to remove the organic binder (debindering).

The molded body is then fired. Firing is preferably carried out, for example, by holding the molded body in a non-oxidizing atmosphere such as in a nitrogen gas or an argon gas in a temperature range of from 1,600 to 1,900° C. for from 1 to 10 hours, particularly preferably from 2 to 7 hours. If the firing temperature is less than 1,600° C., the sintering tends to be insufficient, whereby production of an aluminum nitride sintered body having a thermal conductivity of at least 190 W/mK tends to be difficult. Further, if the firing temperature exceeds 1,900° C., the vapor pressure of aluminum nitride in the furnace tends to be high, whereby densification will hardly be achieved. The holding time is preferably the shortest time over which the density of the sintered body can be made to be 98% or higher within the above temperature range. This is because if the molded body is fired for a long time in a temperature range in which the density of the sintered body will be 98% or higher, the AlN particles will grow more than necessary to form coarse grains, whereby the volume of the two grain boundaries tends to be relatively small as compared with the triple point, and the grain boundary phase tends to be segregated at the triple point in a large amount as compared with the two grain boundaries, and further, the liquid phase of the aluminum composite oxide tends to exude on the surface of the sintered body.

The aluminum nitride powder to be used for production of the above aluminum nitride sintered body is produced preferably by the following production process. This process comprises diluting an aluminum powder having a low oxygen content to a low concentration with a nitrogen gas, atomizing the mixture into a reaction tube having the oxygen concentration controlled for nitriding, and collecting the product in a collection system similarly having the oxygen concentration controlled. Now, one example of the production process will be described in further detail with reference to the drawing.

FIG. 1 is a diagram illustrating one example of an apparatus for production of an aluminum nitride powder. A raw material aluminum powder is supplied in a certain amount to a mixer 2 by means of a feeder 1 for aluminum powder, such as a table feeder or a screw feeder. In the mixer, the aluminum powder is mixed with a nitrogen gas, and the mixture is atomized into a reaction tube 4 made of boron nitride through a nozzle 3. As the nozzle, a ring nozzle may, for example, be used. Around the periphery of the reaction tube, a graphite heating element 6 is disposed to keep a predetermined temperature, and the reaction tube is heated by a high frequency power source 5. The graphite heating element is heat-insulated with a heat insulating material 7 comprising porous carbon beads and supported by a quartz tube 8. The reaction temperature is measured by means of an optical pyrometer employing a temperature-sensing element 11 made of glassy carbon provided at a center portion of the heating element.

The product (aluminum nitride powder) is drawn together with the circulating nitrogen gas in a closed nitrogen circulating line 14 from the furnace bottom portion by a blower 10 and collected in a bag filter 9. The oxygen amount in the reaction tube and the collection system is monitored by oximeters 12 and 13, respectively provided at the downstream portion of the reaction tube and at the closed nitrogen circulating line. Infiltration of the air from the outside is prevented, and the oxygen amount in the reaction tube and the collection tube is controlled, by controlling the nitrogen purity, the air tightness of the reaction tube and the bag filter and the internal pressure of the reaction tube by the balance between the amount of the circulating nitrogen gas and the suction power of the blower, specifically, by keeping the internal pressure to be in a slightly pressurized state (at a level of from 5 to 10 mmAq). Here, the closed nitrogen circulating line means the entire collection system including the bag filter and the blower.

If the average particle size of the raw material aluminum powder to be used in the present invention is large, aluminum will not sufficiently evaporate and unreacted aluminum may remain, and thus the average particle size is at most 40 μm, particularly at most 30 μm. Further, the surface oxide film will be included in the interior of the product aluminum nitride powder, and thus the oxygen amount in the raw material aluminum powder is at most 0.5 mass %, preferably at most 0.4 mass %. Preferred is an atomized powder with which the risk of explosion can be reduced. Further, if the concentration of the aluminum powder in the nitrogen gas is high, spatial dispersion of aluminum particles tends to be poor, and the probability of cohesion between particles tends to be high, whereby formation of an aluminum nitride powder in the form of fine particles may be inhibited, and thus the concentration is at most 100 g, preferably from 50 to 80 g in 1 Nm$^3$ of the nitrogen gas.

The temperature of the reaction tube is preferably from 1,900 to 2,200° C. If it is lower than 1,900° C., the aluminum powder will hardly evaporate, and if it is higher than 2,200° C., formation of fibers of aluminum nitride will take place by priority.

The formed aluminum nitride powder is carried in the closed nitrogen circulating line 14 by an unreacted nitrogen gas and the nitrogen gas circulating in a closed manner by the blower, and collected by a collecting apparatus such as the bas filter 9. What is important is to bring the oxygen concentration at all portions at which the temperature will be at least 100° C. to be at most 100 ppm and to take the product out at a temperature of at most 100° C. If any of these requirements is not met, preparation of an aluminum nitride powder to be used for preparation of an aluminum nitride powder having the above specific particle size and specific oxygen amount will be difficult. Particularly, preparation of an aluminum nitride powder having a BET specific surface area of at least 10 m$^2$/g and a value of the oxygen amount (mass %)/the specific surface area (m$^2$/g) of from 0.1 to 0.2 will not be carried out. Here, the aluminum nitride powder having a BET specific surface area of at least 10 m$^2$/g and a value of the oxygen amount (mass %)/the specific surface area (m$^2$/g) of from 0.1 to 0.2 is a powder in the form of fine particles (i.e. having an increased specific surface area) required for molding at a high filling rate, and is a powder having an oxygen amount which increases as the powder becomes in the form of fine particles and adversely affects the thermal conductivity, suppressed.

In order that no excessive oxide layer will form on the surface of the particles except for the "natural oxide film" which necessarily forms when the aluminum nitride powder is exposed to the air at room temperature, in the present invention, it is required that the oxygen concentration is at most 100 ppm, preferably at most 10 ppm, at all portions at which the temperature will be at least 100° C. at which the oxidation reaction may take place. In this viewpoint, it is very important to take out the product while the internal temperature of the collection apparatus such as the bag filter is kept at 100° C. or lower. It is preferred to employ e.g. a double damper structure for the removal mechanism so that the air will not infiltrate into the collection apparatus such as the bag filter when the product is taken out.

One example of a method for preparing an aluminum nitride powder capable of producing an aluminum nitride sintered body which satisfies both high thermal conductivity and low sintering shrinkage by using the aluminum nitride powder produced by the present invention, is shown below. Namely, the aluminum nitride powder A (having a BET specific surface area of 20 m$^2$/g, an oxygen amount of 2.2 mass % and a value of the oxygen amount (mass %)/the specific surface area (m$^2$/g) of 0.11) produced by the present invention, another aluminum nitride powder B (having a BET specific surface area of 5 m$^2$/g, an oxygen amount of 0.8 mass %) and another aluminum nitride powder C (having a BET specific surface area of 1 m$^2$/g and an oxygen amount of 0.6 mass %) are mixed in a mass ratio of 10:30:60. The aluminum nitride powder thus prepared has a mold density of at least 70% and when sintered at from 1,750 to 1,850° C., the shrinkage factor represented by the percentage of {(dimensions of the molded body before sintering)−(dimensions of the sintered body after sintering)}/(dimensions of the molded body before sintering) will be so low as 12% (usually 16%). Further, the oxygen amount can be suppressed to be 1.0 mass %, whereby a thermal conductivity of 190 W/m·K will be very easily realized.

EXAMPLES

Examples 1 to 16 and Comparative Examples 1 to 13

From the top of a reaction tube in a nitrogen gas atmosphere kept at 1,950° C., a raw material aluminum powder (purity: 99.97 mass %, average particle size: 25 μm) was atomized under a condition of 2 kg/hr employing a nitrogen gas as a carrier gas. On the other hand, a nitrogen gas as a reaction gas was supplied in a total amount including the above nitrogen gas as the carrier gas of 200 l/min to prepare an aluminum nitride powder, which was drawn at the furnace lower portion by a blower and collected by a bag filter.

The aluminum nitride powder was classified by a centrifugal wind power classifier to obtain various aluminum nitride powders differing in the particle size constitution and the oxygen amount. Namely, various coarse particles (classification yield: 10 to 20%) having oxygen amounts of from 0.4 to 0.8 mass % and grain sizes of from 3 to 15 μm, various medium particles (classification yield: 50 to 70%) having oxygen amounts of from 0.9 to 1.8 mass % and grain sizes of from 0.5 to 1.5 μm and various fine particles having oxygen amounts of from 1.8 to 2.6 mass % and grain sizes of 0.3 μm or less, were produced. These powders were suitably combined to prepare various aluminum nitride powders differing in the oxygen amount, having a local maximum value P1 in a region of from 3 to 15 μm, a local maximum value P2 in a region of from 0.5 to 1.5 μm and a local maximum value P3 in a region of 0.3 μm or less, as shown in Tables 1 and 2.

To 100 parts by mass of each of the obtained aluminum nitride powders, a sintering aid (first class reagent, average particle size: about 0.7 μm) in parts by mass as identified in Tables 1 and 2 and 3 parts by mass of an organic binder (polyacrylate) were added and mixed in a wet ball mill employing methanol as a dispersion medium for 3 hours, followed by filtration and drying. Then, press molding under a pressure of 200 MPa was carried out to obtain an aluminum nitride non-fired molded body of 50 mm×50 mm×5 mm, and the relative density (1) of the molded body was measured. Then, the molded body was put in a crucible made of boron nitride (BN) and heated in a nitrogen gas at 600° C. for 2 hours for debindering, and then put in a firing furnace and subjected to normal pressure sintering in a nitrogen gas atmosphere at 1,780° C. for 6 hours to prepare an aluminum nitride sintered body. With respect to the product, the relative density (2) and the thermal conductivity (3) of the sintered body were measured and further, the shrinkage factor (4) at the time of sintering was measured as follows. The results are shown in Tables 1 and 2.

(1) Relative density of the aluminum nitride non-fired molded body: obtained by dividing the total mass of the aluminum nitride powder and the sintering aid by the volume of the aluminum nitride molded body, and dividing the obtained value by the theoretical density of the aluminum nitride sintered body having the content of the sintering aid added. The mass of the aluminum nitride powder and the sintering aid was obtained from the amount of use at the time of raw material preparation.

(2) Relative density of the aluminum nitride sintered body: obtained by dividing the density of the sintered body determined by the Archimedes method by the theoretical density of the aluminum nitride sintered body having the content of the sintering aid added.

(3) Thermal conductivity of the aluminum nitride sintered body: measured by means of a laser flash thermal constants analyzer ("TC-7000" manufactured by Shinku Riko K. K.) by preparing a circular test specimen (diameter: 25 mm×1.5 mm).

(4) Shrinkage factor at the time of sintering aluminum nitride: the longest direction (e.g. the diagonal direction in the case of a rectangular or the major axis direction in the case of an ellipse) of the molded body and the sintered body was measured, the average of the lengths in optional four directions was determined to calculate the shrinkage factor from the formula: shrinkage factor (%)={(dimensions of the molded body before sintering)−(dimensions of the sintered body after sintering)}×100/(dimensions of the molded body before sintering).

The particle size distribution was measured by using a laser diffraction scattering type measuring apparatus ("LS-230" manufactured by Beckman Coulter K.K.), and the oxygen amount was measured by using an oxygen/nitrogen simultaneous analyzer manufactured by HORIBA, Ltd.

TABLE 1

| | Aluminum nitride powder | | | | | | |
|---|---|---|---|---|---|---|---|
| | Local maximum value P1 μm | Local maximum value P2 μm | Local maximum value P3 μm | Local maximum value P1 % | Local maximum value P2 % | Local maximum value P3 % | Oxygen amount (mass %) |
| Ex. 1 | 15 | 1 | 0.1 | 60 | 30 | 10 | 0.87 |
| Ex. 2 | 10 | 1 | 0.1 | 60 | 30 | 10 | 0.96 |
| Ex. 3 | 3 | 1 | 0.1 | 60 | 30 | 10 | 1.11 |
| Ex. 4 | 10 | 1 | 0.1 | 70 | 25 | 5 | 0.80 |
| Ex. 5 | 10 | 1 | 0.1 | 40 | 40 | 20 | 1.26 |
| Ex. 6 | 10 | 0.5 | 0.1 | 60 | 30 | 10 | 1.09 |
| Ex. 7 | 10 | 1 | 0.1 | 60 | 30 | 10 | 0.96 |
| Ex. 8 | 10 | 1.5 | 0.1 | 60 | 30 | 10 | 0.82 |
| Ex. 9 | 10 | 1 | 0.1 | 59.5 | 40 | 0.5 | 0.81 |
| Ex. 10 | 10 | 1 | 0.1 | 55 | 25 | 20 | 1.15 |
| Ex. 11 | 10 | 1 | 0.3 | 60 | 30 | 10 | 0.86 |
| Ex. 12 | 10 | 1 | 0.15 | 60 | 30 | 10 | 0.94 |
| Ex. 13 | 3 | 0.5 | 0.15 | 40 | 40 | 20 | 1.50 |
| Ex. 14 | 15 | 1.5 | 0.3 | 70 | 29 | 1.0 | 0.50 |
| Ex. 15 | 3 | 0.5 | 0.15 | 40 | 40 | 20 | 1.50 |
| Ex. 16 | 15 | 1.5 | 0.3 | 70 | 29 | 1.0 | 0.50 |

| | Sintering aid | | Aluminum nitride non-fired molded body | Aluminum nitride sintered body | | |
|---|---|---|---|---|---|---|
| | Type | Amount (parts by mass) | Relative density % | Relative density % | Shrinkage factor % | Thermal conductivity W/m·K |
| Ex. 1 | Y2O3 | 3 | 70 | 100 | 12 | 205 |
| Ex. 2 | Y2O3 | 3 | 68 | 100 | 13 | 202 |
| Ex. 3 | Y2O3 | 3 | 66 | 100 | 14 | 200 |
| Ex. 4 | Y2O3 | 3 | 69 | 100 | 12 | 205 |
| Ex. 5 | Y2O3 | 3 | 66 | 100 | 15 | 200 |
| Ex. 6 | Y2O3 | 3 | 69 | 100 | 12 | 201 |
| Ex. 7 | Y2O3 | 3 | 71 | 100 | 12 | 205 |
| Ex. 8 | Y2O3 | 3 | 70 | 100 | 13 | 207 |
| Ex. 9 | Y2O3 | 3 | 69 | 100 | 14 | 210 |
| Ex. 10 | Y2O3 | 3 | 68 | 100 | 15 | 205 |
| Ex. 11 | Y2O3 | 3 | 69 | 100 | 13 | 206 |
| Ex. 12 | Y2O3 | 3 | 71 | 100 | 12 | 200 |
| Ex. 13 | Y2O3 | 5 | 65 | 100 | 15 | 195 |
| Ex. 14 | Y2O3 | 1 | 70 | 100 | 12 | 211 |
| Ex. 15 | CaO | 5 | 65 | 100 | 15 | 195 |
| Ex. 16 | CaO | 1 | 70 | 100 | 12 | 209 |

TABLE 2

| | Aluminum nitride powder | | | | | | |
|---|---|---|---|---|---|---|---|
| | Local maximum value P1 μm | Local maximum value P2 μm | Local maximum value P3 μm | Local maximum value P1 % | Local maximum value P2 % | Local maximum value P3 % | Oxygen amount (mass %) |
| Comp. Ex. 1 | 20 | 1 | 0.1 | 60 | 30 | 10 | 0.88 |
| Comp. Ex. 2 | 2 | 1 | 0.1 | 60 | 30 | 10 | 1.12 |
| Comp. Ex. 3 | 10 | 1 | 0.1 | 80 | 15 | 5 | 0.73 |
| Comp. Ex. 4 | 10 | 1 | 0.1 | 30 | 60 | 10 | 1.18 |
| Comp. Ex. 5 | 10 | 2 | 0.1 | 60 | 30 | 10 | 0.81 |

TABLE 2-continued

| | | | | | | | |
|---|---|---|---|---|---|---|---|
| Comp. Ex. 6 | 10 | 0.3 | 0.1 | 60 | 30 | 10 | 1.12 |
| Comp. Ex. 7 | 10 | 1 | 0.1 | 70 | 20 | 10 | 0.88 |
| Comp. Ex. 8 | 10 | 1 | 0.1 | 40 | 50 | 10 | 1.11 |
| Comp. Ex. 9 | 10 | 1 | 0.4 | 60 | 30 | 10 | 0.85 |
| Comp. Ex. 10 | 10 | 1 | 0.1 | 70 | 29.8 | 0.2 | 0.73 |
| Comp. Ex. 11 | 10 | 1 | 0.1 | 45 | 25 | 30 | 1.38 |
| Comp Ex. 12 | 3 | 0.5 | 0.15 | 35 | 40 | 25 | 1.59 |
| Comp. Ex. 13 | 15 | 1.5 | 0.3 | 85 | 14.8 | 0.2 | 0.42 |

| | Sintering aid | | Aluminum nitride non-fired molded body | Aluminum nitride sintered body | | |
|---|---|---|---|---|---|---|
| | Type | Amount (parts by mass) | Relative density % | Relative density % | Shrinkage factor % | Thermal conductivity W/m·K |
| Comp. Ex. 1 | Y2O3 | 3 | 73 | 90 | — | — |
| Comp. Ex. 2 | Y2O3 | 3 | 58 | 99 | 16 | 187 |
| Comp. Ex. 3 | Y2O3 | 3 | 67 | 95 | — | — |
| Comp. Ex. 4 | Y2O3 | 3 | 65 | 99 | 16 | 187 |
| Comp. Ex. 5 | Y2O3 | 3 | 70 | 97 | — | — |
| Comp. Ex. 6 | Y2O3 | 3 | 69 | 99 | 16 | 185 |
| Comp. Ex. 7 | Y2O3 | 3 | 69 | 97 | — | — |
| Comp. Ex. 8 | Y2O3 | 3 | 68 | 99 | 16 | 188 |
| Comp. Ex. 9 | Y2O3 | 3 | 69 | 99 | 16 | 189 |
| Comp. Ex. 10 | Y2O3 | 3 | 70 | 99 | 16 | 187 |
| Comp. Ex. 11 | Y2O3 | 3 | 68 | 99 | 17 | 189 |
| Comp. Ex. 12 | Y2O3 | 5 | 63 | 99 | 16 | 180 |
| Comp. Ex. 13 | Y2O3 | 1 | 68 | 89 | — | — |

Examples 17 and 18 and Comparative Examples 14 and 15

Using the apparatus shown in FIG. 1, an aluminum nitride powder was produced under conditions shown in Table 1. The capacity of the reaction furnace is 170 kVA and the output is 100 kW. The reaction tube 4 made of boron nitride has an inner diameter of 200 mm and a total length of 3,000 mm, and the quartz tube 8 has an inner diameter of 450 mm and a total length of 3,000 mm. As the feeder 1 for aluminum powder, a screw feeder was used. Infiltration of the air from the outside was prevented and the oxygen amount in the system was controlled to be at most 10 ppm by controlling the nitrogen purity, the air tightness of the reaction tube and the bag filter, and the internal pressure of the reaction tube by the balance between the amount of the circulating nitrogen gas and the suction power of the blower. Further, the product was taken out while the internal temperature of the bag filter was kept at 100° C. or lower.

With respect to the obtained aluminum nitride powder, the BET specific surface area and the oxygen amount were measured by means of "QS16 apparatus" manufactured by YUASA IONICS COMPANY, LIMITED and an oxygen/nitrogen simultaneous analyzer "model EMGA620W" manufactured by HORIBA, Ltd., respectively, to calculate the proportion of the oxygen amount (mass %)/the specific surface area ($m^2/g$). The results are shown in Table 3.

TABLE 3

| | Aluminum powder | | | | | BET specific surface area ($m^2/g$) | Oxygen amount in AlN powder | Oxygen amount (%)/ specific surface area ($m^2/g$) |
|---|---|---|---|---|---|---|---|---|
| | Average particle size (μm) | Oxygen amount (%) | Concentration in nitrogen gas (g/Nm³) | Reaction tube temperature (°C.) | Oxygen concentration in process (ppm) | | | |
| Ex. 17 | 30 | 0.4 | 100 | 2,000 | 10 | 10.2 | 1.3 | 0.127 |
| Ex. 18 | 30 | 0.4 | 100 | 2,000 | 5 | 11.2 | 1.2 | 0.107 |
| Comp. Ex. 14 | 45 | 0.2 | 100 | 2,000 | 5 | Unreacted Al remained | | |
| Comp. Ex. 15 | 30 | 0.6 | 100 | 2,000 | 10 | 10.5 | 2.2 | 0.210 |

INDUSTRIAL APPLICABILITY

The aluminum nitride powder of the present invention is useful as a raw material for production of an aluminum nitride sintered body, a filler for a resin or a rubber, etc. Further, the aluminum nitride non-fired molded body of the present invention is useful for production of an aluminum nitride sintered body. Further, the aluminum nitride sintered body of the present invention is useful as a structural member, a radiator board, a ceramic substrate for a circuit board, etc. Particularly, it is suitable as a ceramic substrate for a module for e.g. an electric vehicle.

The aluminum nitride powder produced by the present invention may be used, for example, as one raw material for preparation of an aluminum nitride sintered body which satisfies both high thermal conductivity of the aluminum nitride sintered body and low sintering shrinkage.

The entire disclosure of Japanese Patent Application No. 2004-094567 filed on Mar. 29, 2004 including specification, claims, drawing and summary is incorporated herein by reference in its entirety.

The invention claimed is:

1. An aluminum nitride powder comprising: from 40 to 70% of coarse particles having a size of 3 to 15 μm, from 25 to 40% of medium particles having a size of 0.5 to 1.5 μm, and from 0.5 to 20% of fine particles having a size of 0.3 μm or less, the percentages being on a volume basis, and
   wherein the aluminum nitride powder has an oxygen amount of from 0.5 to 1.5 mass %.

2. An aluminum nitride non-fired molded body comprising a molded body of a powder mixture comprising the aluminum nitride powder as defined in claim 1 and a sintering aid.

3. The aluminum nitride powder according to claim 1, wherein the coarse particles have a size of 5 to 10 μm and are present in an amount of from 50 to 65 volume %.

4. The aluminum nitride powder according to claim 1, wherein the medium particles have a size of 0.8 to 1.3 μm and are present in an amount of from 25 to 35 volume %.

5. The aluminum nitride powder according to claim 1, wherein the fine particles have a size of 0.05 to 0.25 μm and are present in an amount of from 5 to 15 volume %.

6. The aluminum nitride powder according to claim 1, wherein the coarse particles have a size of 5 to 10 μm and are present in an amount of from 50 to 65 volume %, the medium particles have a size of 0.8 to 1.3 μm and are present in an amount of from 25 to 35 volume %, and the fine particles have a size of 0.05 to 0.25 μm and are present in an amount of from 5 to 15 volume %.

7. The aluminum nitride powder according to claim 1, wherein the aluminum nitride powder has an oxygen amount of from 0.8 to 1.3 mass %.

8. A process for producing an aluminum nitride powder comprising:
   dispersively mixing a raw material aluminum powder having an average particle size of at most 40 μm and an oxygen amount of at most 0.5 mass % with a nitrogen gas in a proportion of at most 100 g per 1 $Nm^3$ of the nitrogen gas,
   atomizing the gas into a reaction tube for nitriding, and
   collecting, in a collection system, the aluminum nitride powder, said aluminum nitride powder comprising
      from 40 to 70% of coarse particles having a size of 3 to 15 μm,
      from 25 to 40% of medium particles having a size of 0.5 to 1.5 μm, and
      from 0.5 to 20% of fine particles having a size of 0.3 μm or less,
      the percentages being on a volume basis, and said aluminum nitride powder having an oxygen amount of from 0.5 to 1.5 mass %,
   wherein the oxygen concentration at a portion at which the temperature will be at least 100° C. in the reaction tube and the collection system is controlled to be at most 100 ppm, and the product is taken out at a temperature of at most 100° C.

9. The process according to claim 8, wherein the formed aluminum nitride powder has a BET specific surface area of at least 10 $m^2/g$ and a value of the oxygen amount (mass %)/the specific surface area ($m^2/g$) of from 0.1 to 0.2.

* * * * *